(12) United States Patent
Valcore, Jr.

(10) Patent No.: US 8,909,365 B2
(45) Date of Patent: Dec. 9, 2014

(54) METHODS AND APPARATUS FOR CONTROLLING A PLASMA PROCESSING SYSTEM

(75) Inventor: John C. Valcore, Jr., San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 268 days.

(21) Appl. No.: 12/950,710

(22) Filed: Nov. 19, 2010

(65) Prior Publication Data

US 2011/0118863 A1 May 19, 2011

Related U.S. Application Data

(60) Provisional application No. 61/303,628, filed on Feb. 11, 2010, provisional application No. 61/262,886, filed on Nov. 19, 2009.

(51) Int. Cl.
G06F 19/00 (2011.01)
G01N 27/62 (2006.01)

(52) U.S. Cl.
CPC .................................... *G01N 27/62* (2013.01)
USPC ............. 700/121; 700/55; 700/108; 702/190; 438/10

(58) Field of Classification Search
USPC ........................................................ 700/108
See application file for complete search history.

(56) References Cited

U.S. PATENT DOCUMENTS

| | | | | |
|---|---|---|---|---|
| 4,420,790 A | * | 12/1983 | Golke et al. | 361/283.3 |
| 5,474,648 A | * | 12/1995 | Patrick et al. | 438/10 |
| 5,479,340 A | * | 12/1995 | Fox et al. | 700/33 |
| 5,737,177 A | | 4/1998 | Mett et al. | |
| 5,764,471 A | | 6/1998 | Burkhart | |
| 5,812,361 A | | 9/1998 | Jones et al. | |
| 5,894,400 A | | 4/1999 | Graven et al. | |
| 5,980,767 A | * | 11/1999 | Koshimizu et al. | 216/60 |
| 6,198,616 B1 | | 3/2001 | Dahimene et al. | |
| 6,522,121 B2 | | 2/2003 | Coumou | |
| 6,535,785 B2 | * | 3/2003 | Johnson et al. | 700/121 |
| 6,597,002 B1 | * | 7/2003 | Kondo | 250/492.2 |
| 6,677,246 B2 | * | 1/2004 | Scanlan et al. | 438/723 |
| 7,169,625 B2 | * | 1/2007 | Davis et al. | 438/9 |
| 7,359,177 B2 | | 4/2008 | Yang et al. | |

(Continued)

FOREIGN PATENT DOCUMENTS

JP 2001-127045 5/2001
JP 2004-3355921 11/2004

(Continued)

OTHER PUBLICATIONS

"International Search Report", PCT Application No. PCT/US2010/057450, Mailing Date: Jul. 18, 2011.
"Written Opinion", PCT Application No. PCT/US2010/057450, Mailing Date: Jul. 18, 2011.
"International Search Report", PCT Application No. PCT/US2010/057478, Mailing Date: Jul. 26, 2011.

(Continued)

*Primary Examiner* — Sean Shechtman
(74) *Attorney, Agent, or Firm* — Martine Penilla Group, LLP

(57) ABSTRACT

A method and apparatus for compensating a bias voltage at the wafer by measuring RF voltage signals in RF driven plasma including at least an electrostatic, chuck (ESC), a capacitive divider, a signal processing and signal conditioning network is disclosed. The bias compensation device includes a capacitive divider to detect the RF voltage at the ESC, a signal conditioning network for the purpose of filtering specific RF signals of interests, and a signal processing unit for computing the DC wafer potential from the filtered RF signals.

19 Claims, 12 Drawing Sheets

(56) References Cited

U.S. PATENT DOCUMENTS

| | | | |
|---|---|---|---|
| 7,505,879 B2 * | 3/2009 | Tomoyasu et al. | 703/2 |
| 7,728,602 B2 | 6/2010 | Valcore et al. | |
| 7,768,269 B2 | 8/2010 | Pipitone et al. | |
| 2003/0082835 A1 | 5/2003 | McChesney et al. | |
| 2003/0103793 A1 | 6/2003 | Murakoshi et al. | |
| 2004/0028837 A1 | 2/2004 | Fink | |
| 2004/0060660 A1 | 4/2004 | Klimecky et al. | |
| 2004/0087047 A1 | 5/2004 | Jaiswal et al. | |
| 2004/0135590 A1 | 7/2004 | Quon | |
| 2005/0252884 A1 | 11/2005 | Lam et al. | |
| 2006/0100824 A1 * | 5/2006 | Moriya | 702/183 |
| 2007/0065594 A1 | 3/2007 | Chiang et al. | |
| 2009/0151871 A1 | 6/2009 | Pease et al. | |

FOREIGN PATENT DOCUMENTS

| | | |
|---|---|---|
| KR | 10-2005-0088438 | 9/2005 |
| KR | 10-2005-0089995 | 9/2005 |
| KR | 10-2007-0031915 | 3/2007 |
| WO | WO-2008-002938 | 1/2008 |

OTHER PUBLICATIONS

"Written Opinion", PCT Application No. PCT/US2010/057478, Mailing Date: Jul. 26, 2011.

U.S. Appl. No. 61/303,628, filed Feb. 11, 2010.

"US Utility Application", U.S. Appl. No. 12/907,859, filed Oct. 19, 2010.

"US Continuation-In-Part Application", U.S. Appl. No. 12/962,524, filed Dec. 7, 2010.

"Non Final Office Action", U.S. Appl. No. 12/962,524, Mailing Date: Apr. 12, 2012.

"International Search Report", PCT Application No. PCT/US2011/063422, Mailing Date: Mar. 28, 2012.

"Written Opinion", PCT Application No. PCT/US2011/063422, Mailing Date: Mar. 28, 2012.

"International Preliminary Report on Patentability", PCT Application No. PCT/US2010/057478, Mailing Date May 31, 2012.

"International Preliminary Report on Patentability", PCT Application No. PCT/US2010/057450, Mailing Date Mahy 31, 2102.

"Non Final Office Action", U.S. Appl. No. 12/907,859, Mailing Date: Dec. 12, 2012.

* cited by examiner

How are the 2 methods Different?

- Initial Method Utilizes MVA [multivariate analysis] to create a LINEAR Transfer Function
  - PLS (partial least squares) implemented for each state space to create linear transfer function [RF Voltage to Wafer Bias]
- Current Method Utilizes Non-Linear Transfer Function [power equation]
  - Power Equation used based on existing Physical Relationship of RF Power to RF Voltage
    - Voltage = sqrt( Power / R )
      - This can be rewritten to V = a * (Power/|Z|) ^ b + c
        - In Theory, a = 1, b = .5, and c = 0
  - Impedance of the Plasma is a Function of RF Power Delivered *as well as* Process Parameter [Chemistry, Pressure, Flow, Chamber Coupling (Capacitive/Inductive)]
  - First Order Approximation, V_wafer_dc = V_rf
- For a given Frequency, Explicit Power Equation Can be Used to Relate RF Voltage to Wafer DC Voltage
  - V_wafer_dc = a * V_rf ^ b + c
    - Coefficients a, b, c are optimized to cover entire operating range of Plasma impedance for a given Frequency

FIGURE 8

Further Details

- 7 state spaces exist
  - For single frequency, single equation exists ($V\_wafer\_dc = a * Vpp \wedge b + c$)
    - Coefficient {a} is bounded by [.3 3]
    - Coefficient {b} is bounded by [.5 and 1] (can never be greater than one)
    - Coefficient {c} is typically 0. (more or less compensate for measurement inaccuracy)
  - For multi frequency state
    - Each Frequency's contribution is computed based upon Single Frequency Transfer Function
    - Individual Frequency's contributions are Summed together
    - Final Result, $V\_wafer\_dc = a * V\_summation \wedge b + c$
      - Coefficients {a, b, c} have same bounds

- WHY Does this work?
  - Revisiting $V = sqrt(Power / |Z|)$, and first order approximation $V\_wafer\_dc = V\_rf$
  - Coefficient {a} is a function of Plasma Impedance
  - Coefficient {b} is a function of RF Voltage Peak Detection Method
  - Coefficient {c} is a function of calibration

FIGURE 9

Further Details

- In theory, you could simply have one power equation

- $V\_wafer\_dc = a * (Sum(RF\_Pwr\_2MHz/|Z2MHz| + RF\_Pwr\_27MHz/|Z27Mhz| + RF\_Pwr\_60MHz/|Z60MHz|))^b + c$

- Coefficients {a,b,c} where optimized to account for accuracy/precision of Delivered Power and Plasma Impedance Measurements

FIGURE 10

METHODS AND APPARATUS FOR CONTROLLING A PLASMA PROCESSING SYSTEM

PRIORITY CLAIM

This application claims priority under 35 USC. 119(e) to a commonly-owned provisional patent application entitled "BIAS COMPENSATION APPARATUS AND METHODS THEREFOR", U.S. Application No. 61/303,628, filed on Feb. 10, 2010 by John Valcore, Jr. and a commonly-owned provisional patent application entitled "METHOD AND DEVICE FOR COMPENSATING WAFER BIAS IN A RF DRIVEN PLASMA CHAMBER", U.S. Application No. 61/262,886, filed on Nov. 19, 2009 by John Valcore, Jr., both of which are incorporated herein by reference.

BACKGROUND OF THE INVENTION

In the semiconductor industry, the use of radio frequency (RF) driven plasma chambers for manufacturing silicon wafers is commonplace. There exists a common need within such applications to monitor the sheath voltage, and specifically how the sheath voltage relates to the direct current (DC) bias potential of the wafer itself.

Currently, there are several techniques to ascertain wafer potential, as well as sheath and bulk plasma potential. With respect to the wafer DC bias potential, one monitoring method includes measuring the self-bias voltage of the wafer by detecting the leakage current between the wafer and the electrostatic chuck (ESC) while varying an applied DC voltage to the ESC. While this technique is used within some current production settings, the computed value is highly dependent upon the magnitude of the leakage current, which is coupled to the type of ESC in the system. The method of detecting leakage current through the wafer to the ESC is also highly dependent upon different types of backside wafer films.

Another method for ascertaining the wafer bias potential is through the use of silicon carbide pins attached to the outer edge of the ESC and in contact with the plasma. However, such pins are consumables and have to be replaced frequently within production environments.

A third method for detecting the DC bias on the wafer is through a RF voltage probe at the ESC and a signal processing unit which computes the wafer voltage from the peak to peak RF voltage. This method provides a means for detecting the wafer DC bias voltage without a probe in direct contact with the plasma by scaling the RF voltage at the ESC to a DC value through the use of a calibrated gain and offset. This method assumes a purely linear relationship to the RF peak to peak voltage and the DC potential of the wafer which is not the case for multi-frequency plasmas. FIG. 1 shows the correlation of wafer bias to RF Vpp. In FIG. 1, when a linear fit is applied, the R-squared value is significantly less than one [e.g., R-sq: 0.90].

BRIEF DESCRIPTION OF THE DRAWINGS

The present invention is illustrated by way of example, and not by way of limitation, in the figures of the accompanying drawings and in which like reference numerals refer to similar elements and in which:

FIGS. 6-10 discuss the high impedance RF voltage probe for computing wafer potential based on frequency dependent RF voltage signals.

DETAILED DESCRIPTION OF EMBODIMENTS

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described herein below, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

Figure 1:
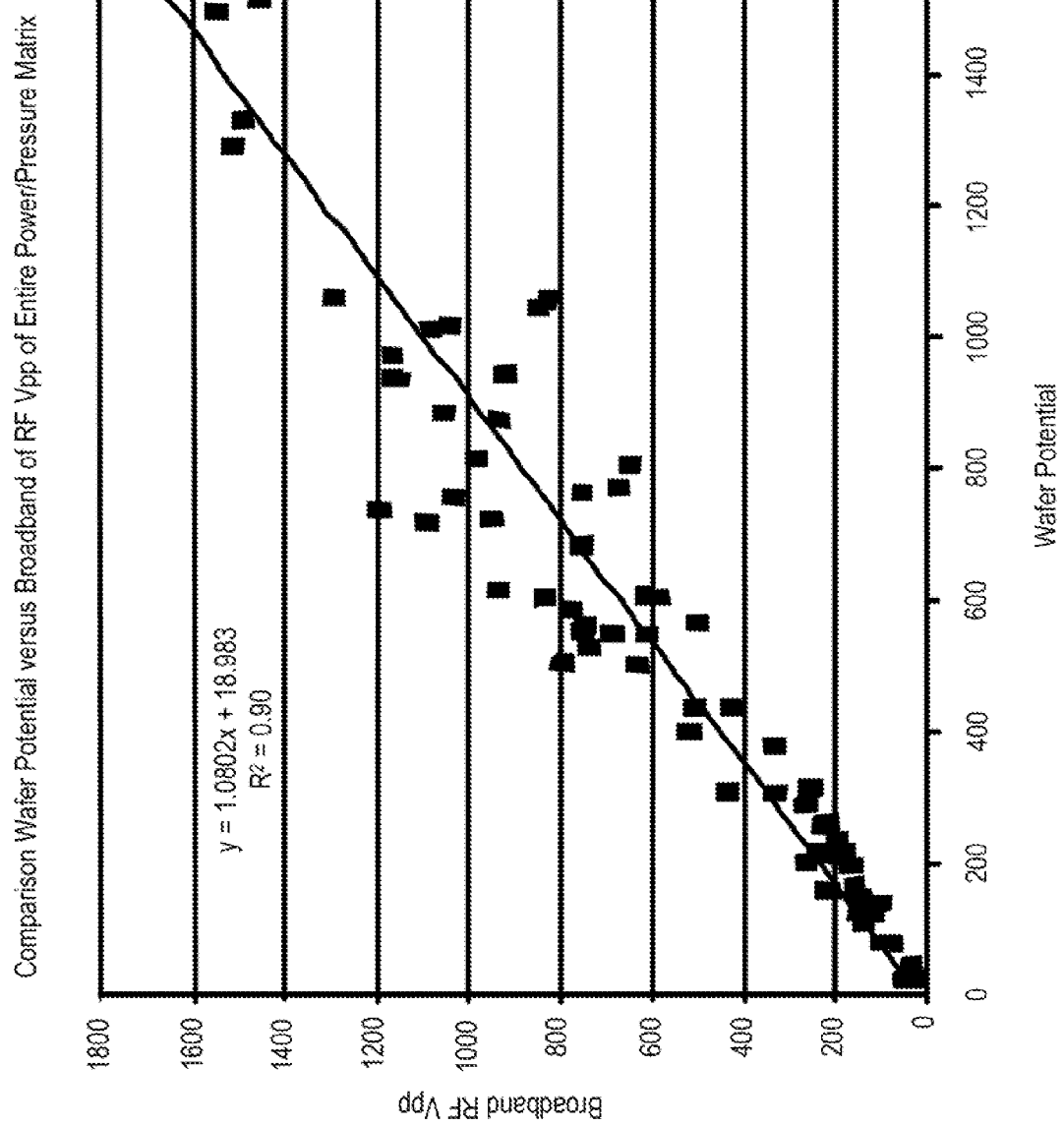
FIG. 1 shows the correlation of wafer bias to RF Vpp.
Figure 2:
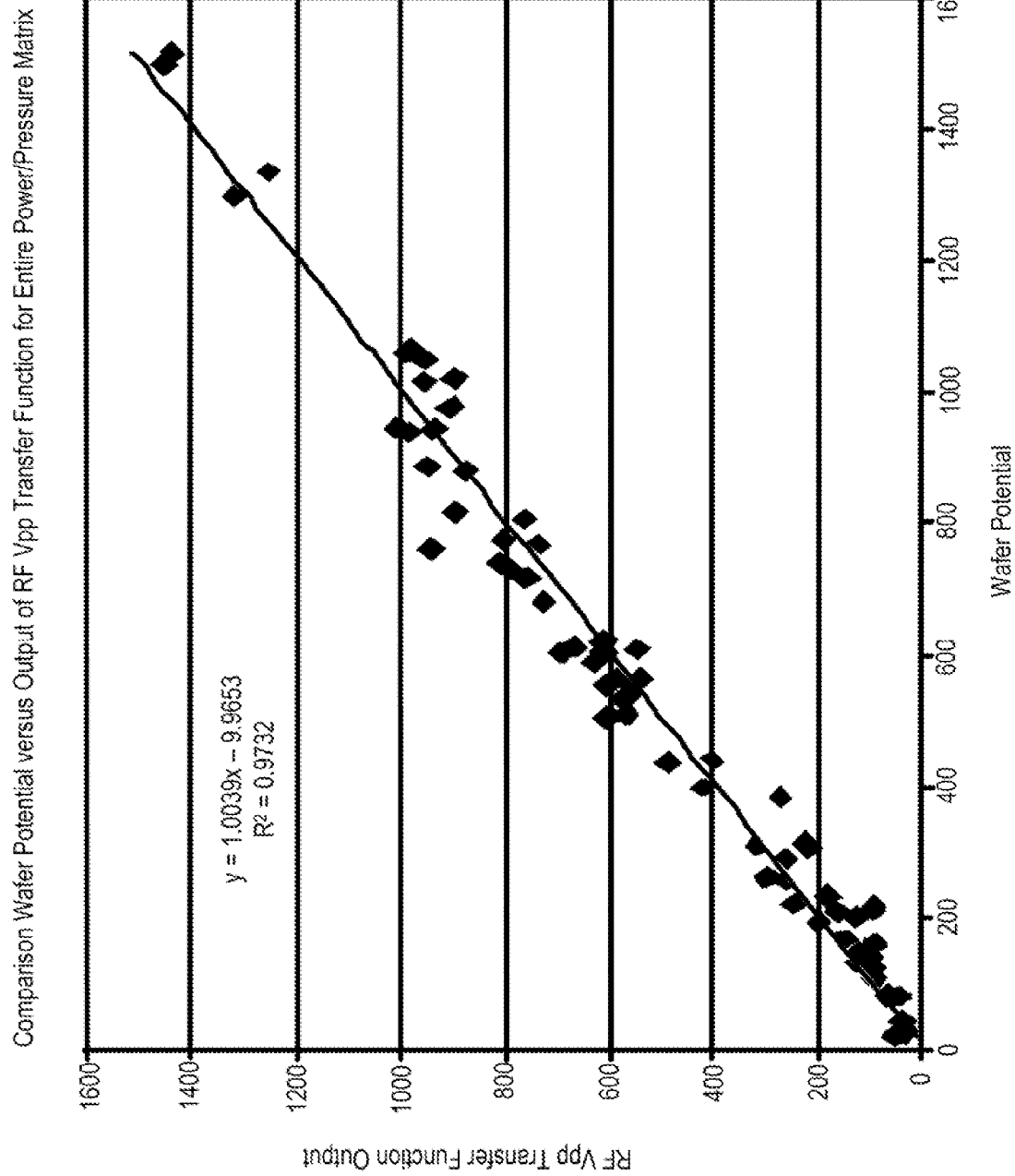
FIG. 2 shows the correlation of the wafer bias to the output of the disclosed RF voltage transfer function, with an R-squared value significantly closer to one.

Embodiments of the disclosed invention will provide the end user the ability to measure the wafer bias potential by appropriately filtering and conditioning the RF voltage at the ESC and utilizing a transfer function that accounts for contribution of multiple RF frequencies in biasing the wafer. FIG. 2 shows the correlation of the wafer bias to the output of the disclosed RF voltage transfer function, with an R-squared value significantly closer to one [e.g., R-sq: 0.97].

This invention was conceived while attempting to improve an existing method of measuring DC bias Potential with a silicon carbide pin. The wear rate of this pin as well as the quartz insulating material which housed the pin was found to be a limiting factor for production throughput. It has been determined that although a non-linear relationship existed between the RF voltage and wafer potential in a multi-frequency plasma, a transfer function could be used to derive wafer potential based upon the contribution of each individual frequency driving the plasma.

Figure 3:
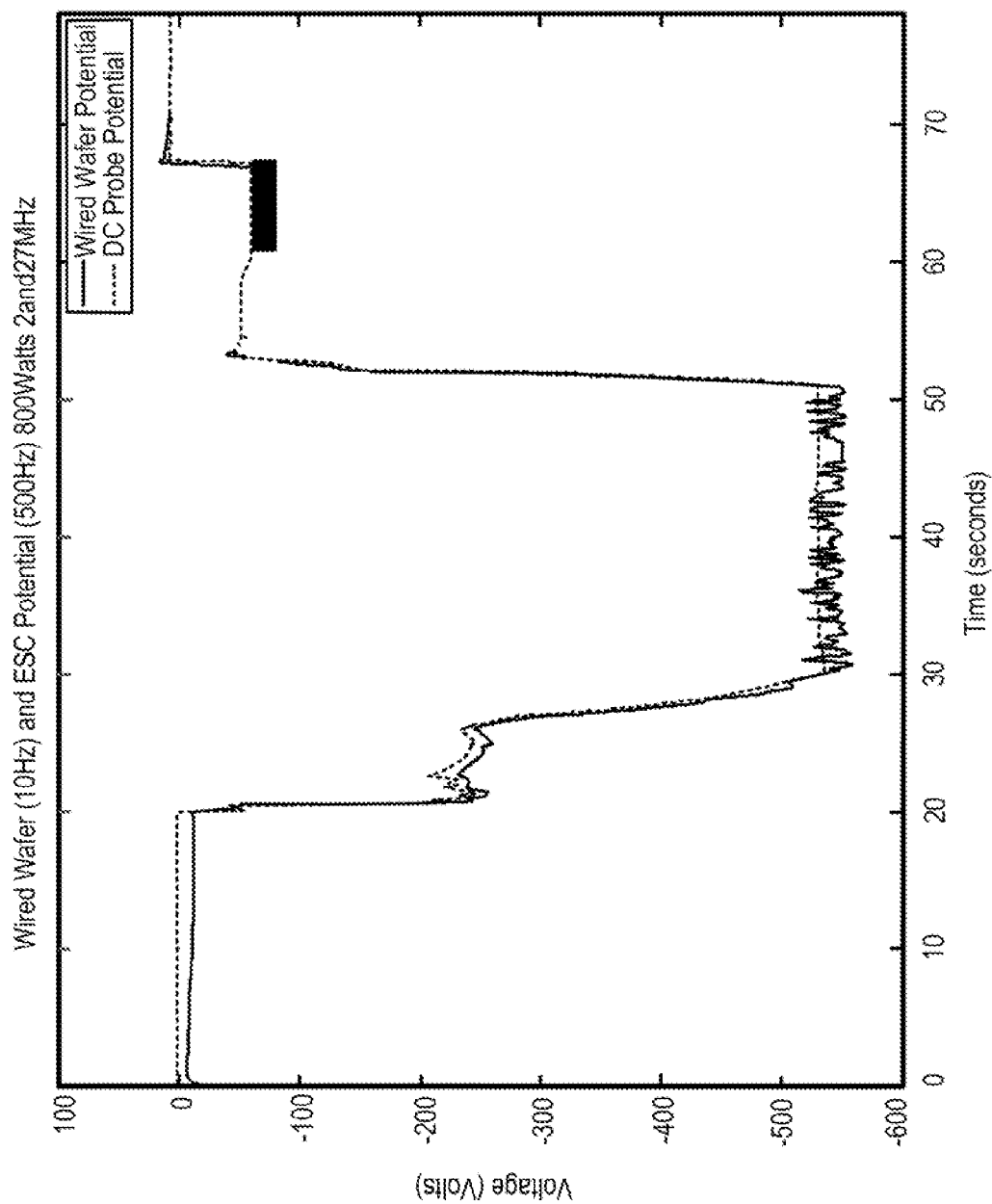
FIG. 3 depicts testing confirming the relationship between the plasma potential as seen by a Si carbide pin and the wafer potential as measured by a wired wafer.

Testing has been done to confirm the relationship between the plasma potential as seen by a Si carbide pin and the wafer potential as measured by a wired wafer, depicted in FIG. 3. It is then shown that the disclosed transfer function was significantly correlated to the voltage signal seen by the existing Si carbide pin.

Figure 4:
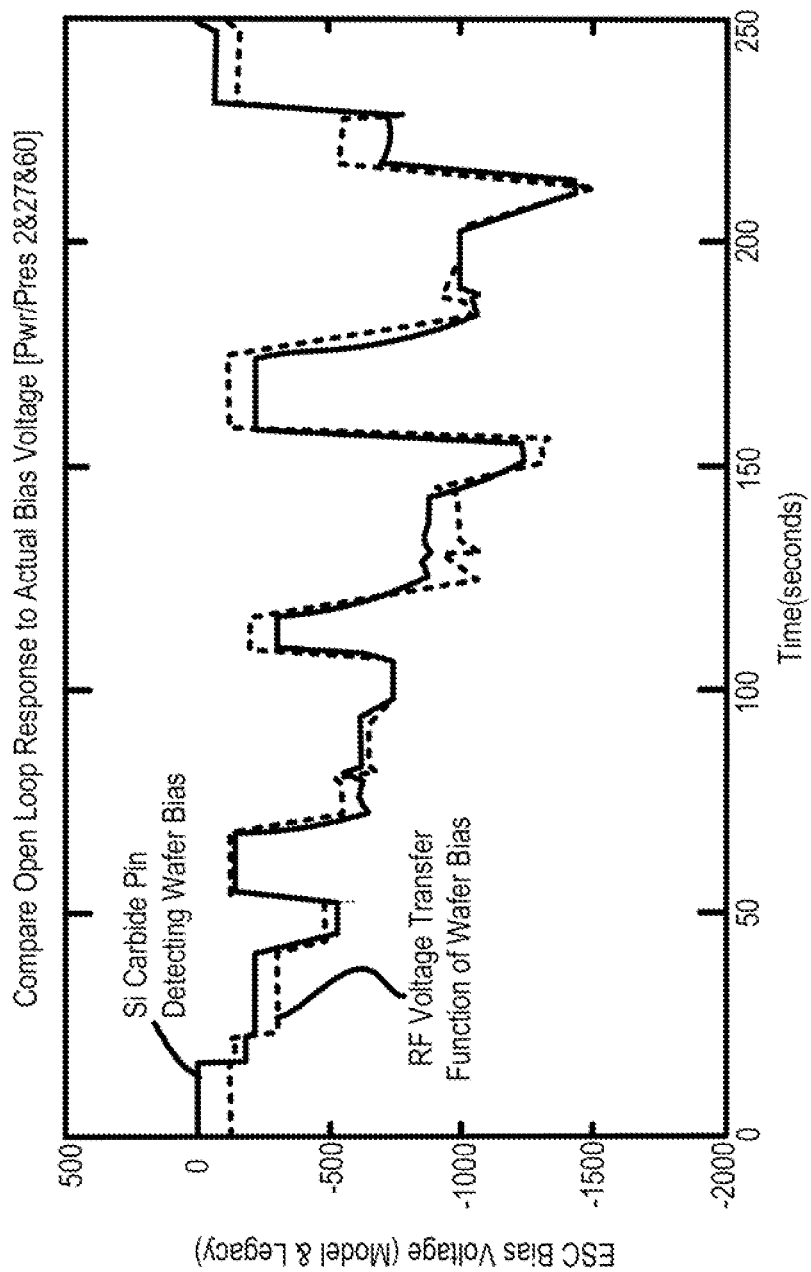
FIG. 4 shows the voltage seen by the Si HER (Hot Edge Ring,) during a HARC (High Aspect Ratio Contact) process using 2 MHz, 27 MHz, and 60 MHz on a Lam DFC2300 FLEX45 platform versus the voltage seen by Si carbide pin.

FIG. 4 shows the voltage seen by the Si HER (Hot Edge Ring) during a HARC (High Aspect Ratio Contact) process using 2 MHz, 27 MHz, and 60 MHz on as Lam DFC2300 FLEX45 platform (available from Lam Research Corporation of Fremont, Calif.) versus the voltage seen by Si carbide pin. Given the aforementioned correlation of the Si carbide pin to the wired wafer, the commutative property provides credence to the statement that a transfer function involving individual RF voltages driving plasma is also a valid representation of the plasma sheath voltage at the wafer interface. In one or more embodiments, state-space analysis may be performed on the RF voltage to derive the transfer functions. State-space modeling is well-known and will not be elaborated here. In one or more embodiments, known transient handling techniques may be applied to improve robustness.

The features and advantages of embodiments of the invention may be better understood with reference to the figures and discussions that follow.

Figure 5A:
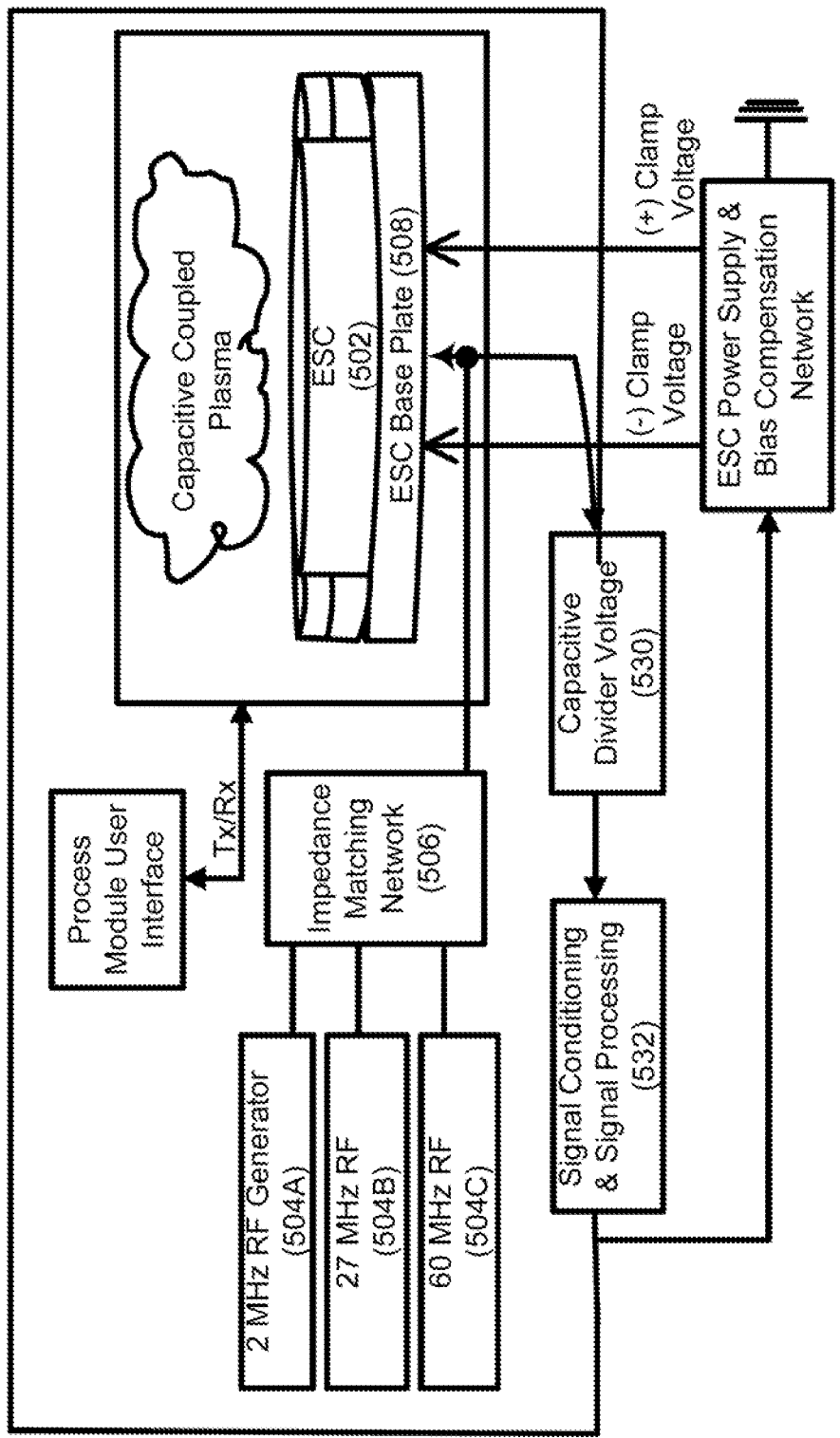
FIG. 5A depicts a system with a RF driven plasma that consists of an ESC power by three RF generators.

Generally speaking, the ability to indirectly measure the DC component of the plasma sheath potential within a RF driven plasma is dependent on a voltage probe connected to the RF rod in close proximity to the ESC. FIG. 5A depicts a system with a RF driven plasma that consists of an ESC 502 power by three RF generators 504A, 504B, and 504C via an impedance matching network 506. These RF generators provide different RF frequencies as shown although the number of frequencies employed, the exact frequencies employed as well as the number of RF generators employed may vary according to applications. An RF rod or another suitable RF sensing mechanism in close proximity (i.e., sufficiently close as to be able to sense the RF voltage) to base plate 508 (or another non-plasma exposing component associated with the ESC) provides a RF voltage to capacitive divider network 530. Capacity divider 530 will be discussed in greater details herein in connection with FIG. 5B. The output of capacitive divider network 530 is then provided to a signal conditioning and processing block 532, which will be discussed in greater details in connection with FIG. 5C herein below.

Figure 5B:
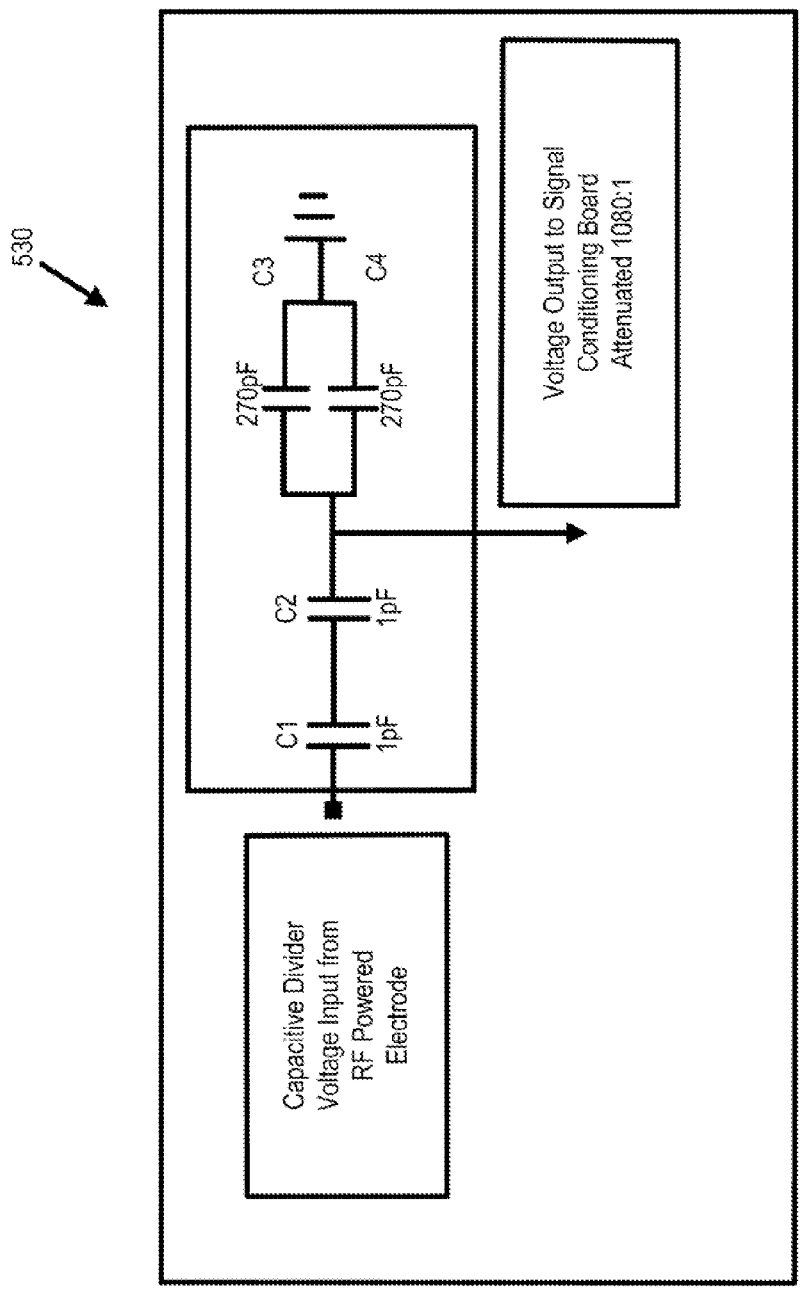
FIG. 5B illustrates an embodiment of the disclosed invention, where a voltage probe, consisting of a capacitive divider network, is attached to the RF rod in close proximity to the ESC base plate as well as a signal conditioning and signal processing apparatus.

FIG. 5B illustrates an example embodiment of the disclosed invention, where a voltage probe, including a capacitive divider network 530, is coupled to the RF rod (or another suitable RF sensing mechanism) in close proximity to the ESC base plate as well as coupled to a signal conditioning and signal processing apparatus. In the example of FIG. 5B, capacitor C1 is in series with capacitor C2, which is then in series with the parallel capacitors C3/C4. The voltage signal is obtained as shown in FIG. 5B. The capacitive divider voltage probe provides a high impedance path for the RF voltage to be sensed without unduly perturbing the RF power driving the plasma.

The specific make up of the capacitive divider is dependent upon the RF generators driving the plasma, with the highest frequency generator being the dominant factor. The capacitive divider also sufficiently attenuates the voltage signal by providing a low impedance path to ground in parallel with a 50-ohm coaxial cable responsible for carrying the voltage signal to the signal conditioning and signal processing apparatus. Note that these values are provided as example and for reference only and are not limiting. In the example of FIG. 5B the input impedance is significantly high [$Z=1/(\omega*C)$, when $\omega=60$ MHz, $C=0.5$ pF then $Z\sim33$ Kohms] and the impedance to ground is low (~31 ohms@60 Mhz).

Figure 5C:
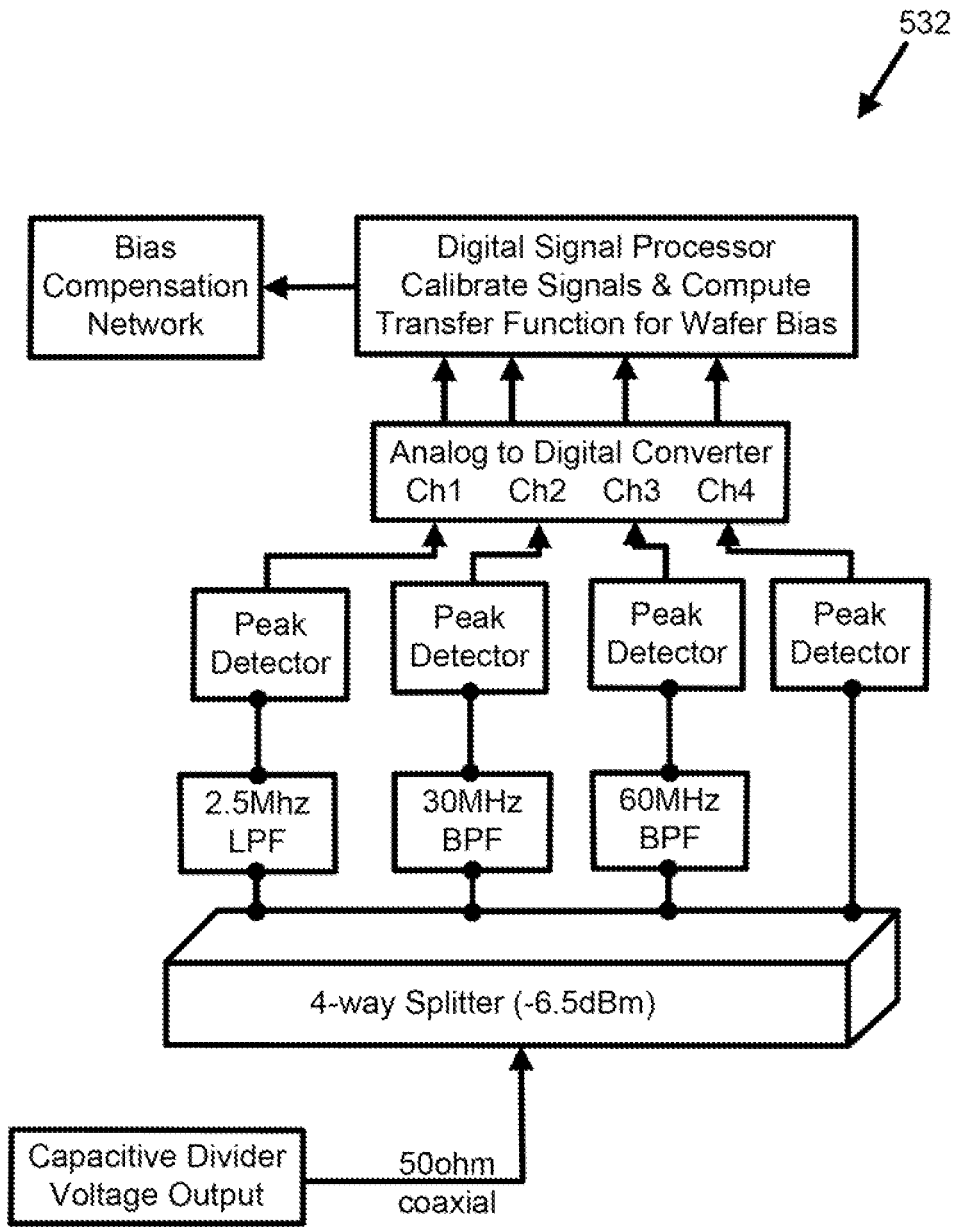
FIG. 5C is an embodiment of an analog RF voltage signal conditioning network with a digital signal processing unit.

The RF voltage signal is then conditioned through a network of analog or digital filters. FIG. 5C is an example embodiment of an analog RF voltage signal conditioning network of the type implemented in block 532 of FIG. 5A. At the input of the analog RF voltage signal conditioning network, the signal is split into a number of separate channels (4 in the example of FIG. 5C) to allow for RF filtering of specific RF frequencies responsible for driving the plasma. In this embodiment, the RF generator frequencies are 2 MHz, 27 MHz, and 60 MHz. One channel is not filtered, which maintains the broadband voltage frequency spectrum. In this embodiment the four channels are converted to a DC signal via a passive peak detector [e.g., 1N5711 diode], although an active peak detector could be used as well.

The DC signals are then converted to digital signals in order to be processed by the digital signal processor, where the individual signals are calibrated and inputted into the wafer bias transfer function. The output of the transfer function is then fed back to the bias compensation network. It should be noted that the disclosed analog signal conditioning network could be accomplished entirely within the digital domain. In this instance, there would be no need for a signal splitter or analog filters, simply an analog to digital converter (ADC) and a signal processing unit (digital signal processor (DSP), field programmable gate array (FPGA), complex programmable logic device (CPLD) or the like), with the signal processing unit responsible for all filtering, peak detection, calibration, and transfer function computation.

In one or more embodiments, the calibration of each voltage channel is performed by applying a gain and offset to each channel. The gain and offset for each channel (2 MHz, 27 MHz, 60 MHz and broadband unfiltered voltages in the example of FIGS. 5A-5C) is determined by the signal response of a given channel and its correlation to the wafer bias. For the filtered channels, this is accomplished by characterizing a given filtered channel response to the wafer bias for that unique single frequency. For instance, the response of the 2 MHz channel would be correlated to the wafer bias for plasma being driven by 2 MHz only and the subsequent gain and offset would be used to calibrate this channel. This is repeated for 27 MHz and 60 MHz. The broadband signal is calibrated by correlating the wafer bias for plasma being driven by all three frequencies and each subsequent variation (2 MHz only, 2 MHz and 27 MHz, 60 MHz only, 27 MHz and 60 MHz, etc. . . . ).

An important factor into the calibration is also the response of the capacitive divider voltage probe 530. The capacitive divider tends to have a unique signal response for each frequency. As a suggested solution, a network analyzer can be used to characterize the response of the capacitive divider voltage sensor, and this response can then used to modify the aforementioned calibration coefficients accordingly. This is an important component in manufacturing accurate and repeatable instruments.

The transfer function for computing wafer bias in composed of four inputs: the calibrated DC voltage signals for 2 MHz, 27 MHz, and 60 MHz as well as the unfiltered broadband signal. The voltage signals are then multiplied by a set of coefficients. Each coefficient is a function of a given frequency mixture driving the plasma. The coefficients are derived through, for example, principal component analysis (PCA) of the matrix consisting of the wafer bias and the four voltage signals (2 MHz 27 MHz, 60 MHz, and broadband). The individual resultants of the coefficient multiplication are then summed, producing a wafer bias value. Conditional statements and weighting factors can also be used to optimize the coefficients and thus optimize the transfer function result.

Figure 6:
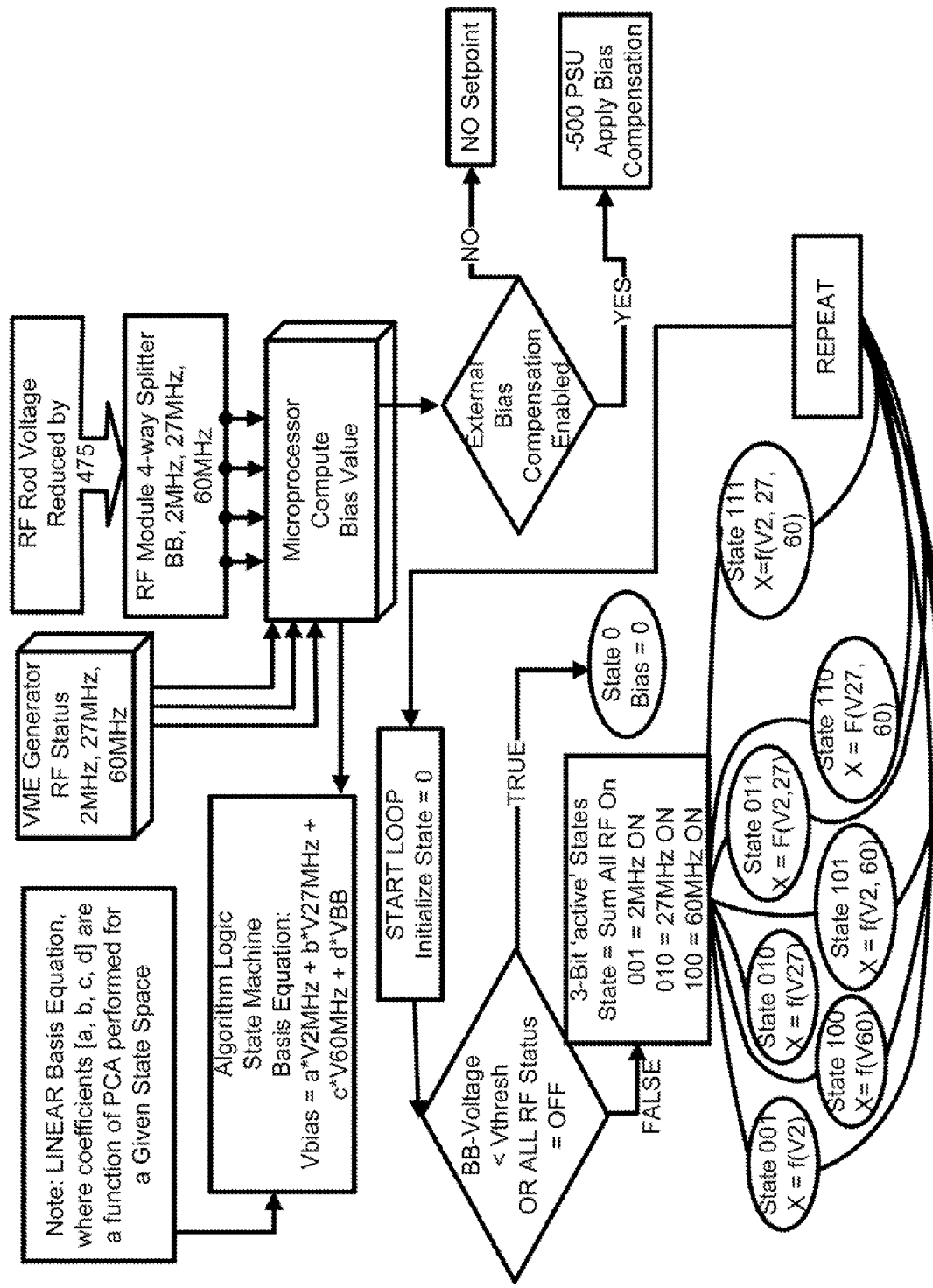
Figure 7:
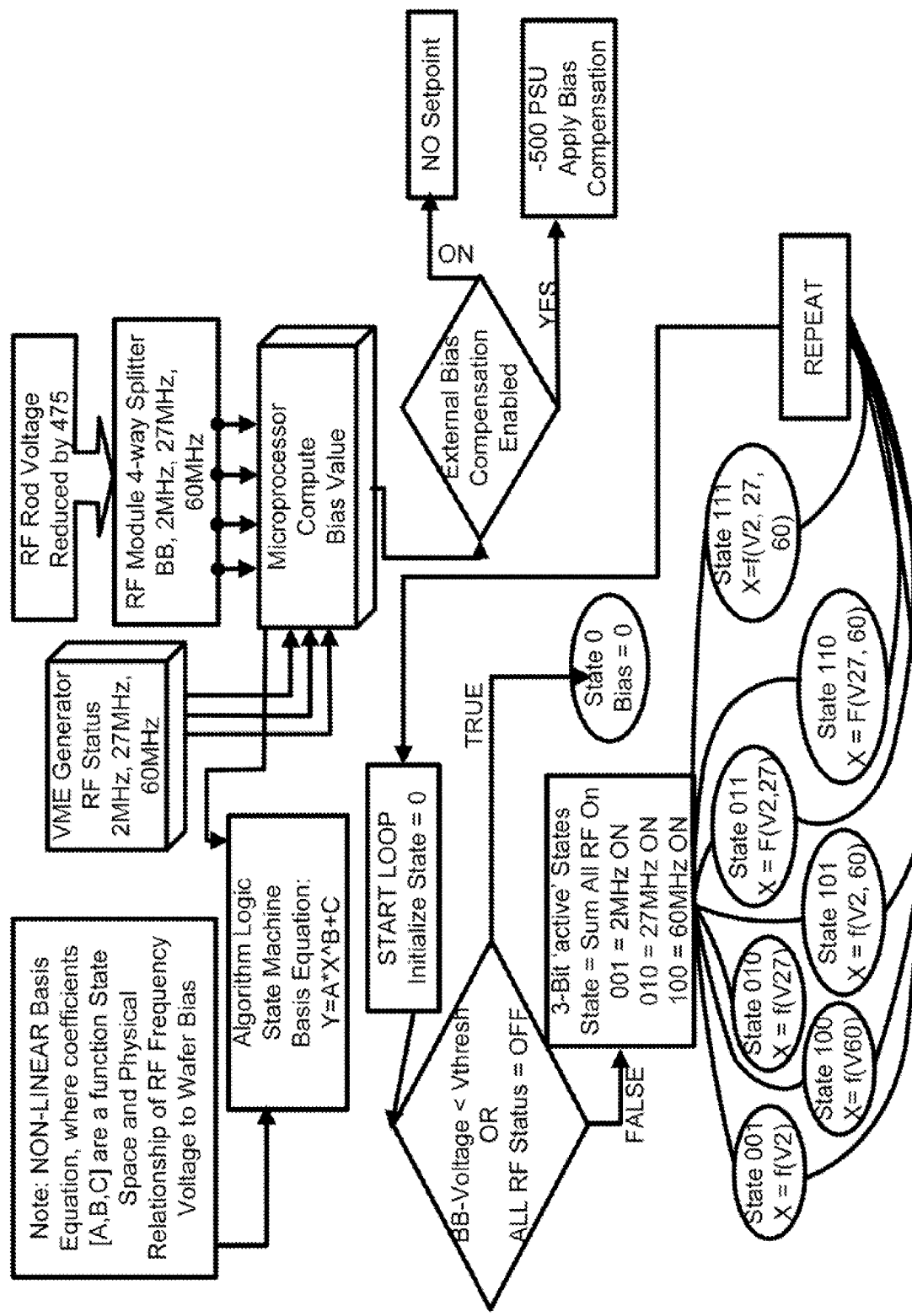

FIGS. 6-10 further discuss the high impedance RF voltage probe for computing wafer potential based on frequency dependent RF voltage signals. In FIG. 6, a linear transfer function is created and the example flowchart illustrates how this linear transfer function may be employed to produce the wafer bias value. FIG. 7 is a flowchart illustrating the use of a non-linear transfer function to produce the wafer bias value. Non-linear transfer functions are believed to be better able to approximate the wafer bias value from the RF voltage in some, if not most, situations. FIGS. 8, 9, and 10 are further explanation of the merits of each approach (linear vs. nonlinear). Both approaches provide a way, in accordance with embodiments of the invention, to correlate the sensed RF voltage to the wafer bias voltage, especially in multi-frequency applications. The wafer bias voltage may then used as a feedback or control signal for the ESC power supply and/or bias compensation network and/or other subsystems in the plasma processing system.

While this invention has been described in terms of several preferred embodiments, there are alterations, permutations, and equivalents, which fall within the scope of this invention. It should also be noted that there are many alternative ways of implementing the methods and apparatuses of the present invention. Although various examples are provided herein, it is intended that these examples be illustrative and not limiting with respect to the invention.

What is claimed is:

1. A method comprising:
obtaining a radio frequency (RF) voltage signal from an RF sensing mechanism via a high impedance path, the RF voltage signal having multiple RF frequencies associated with multiple RF generators, the multiple frequencies including a first frequency and a second frequency, said RF sensing mechanism is an RF rod, wherein said RF rod is proximate to a component of an electrostatic chuck (ESC) subsystem, wherein the component is outside a region having plasma when formed in a plasma chamber, wherein the RF rod is used for sensing said RF voltage signal, said RF rod providing said RF voltage signal to a capacitor divider network;
processing said RF voltage signal to generate a plurality of signals, one of the signals in said plurality of signals having the first frequency and another one of the signals in said plurality of signals having the second frequency;
applying a transfer function to the signal having the first frequency and the other signal having the second frequency to derive a wafer potential; and
providing the wafer potential as a control signal to control at least a subsystem of said plasma processing system.

2. The method of claim 1, wherein said component is a base plate.

3. The method of claim 1, wherein said plurality of signals includes at least a signal corresponding to an unfiltered broadband version of said RF voltage signal.

4. The method of claim 1, wherein said processing includes calibrating said plurality of signals wherein said calibrating is responsive to said capacitor divider network.

5. The method of claim 1, wherein said transfer function is a linear transfer function.

6. The method of claim 5, wherein said linear transfer function is obtained using multi-variate analysis.

7. The method of claim 1, wherein said transfer function is a non-linear transfer function.

8. The method of claim 7, wherein said non-linear function is obtained using a power equation.

9. The method of claim 1, wherein said processing includes analog filtering.

10. The method of claim 1, wherein said processing includes digital signal processing.

11. The method of claim 1, wherein said processing comprises filtering the signals in said plurality of signals to split the signals into the signal having the first frequency and the other signal having the second frequency.

12. The method of claim 1, wherein said processing comprises generating a peak magnitude of the signal having the first frequency and a peak magnitude of the other signal having the second frequency.

13. A plasma processing system configured for processing at least one wafer disposed on an electrostatic chuck (ESC), the plasma processing system comprising:
a radio frequency (RF) sensing mechanism, said RF sensing mechanism is proximate to a component of said ESC to obtain an RF voltage signal, wherein the component is outside a region having plasma when formed in a plasma chamber, the RF voltage signal having multiple frequencies associated with multiple RF generators, the multiple frequencies including a first frequency and a second frequency, said RF sensing mechanism is an RF rod and said component is a base plate;
a high impedance voltage probe arrangement coupled to said RF rod, wherein said high impedance voltage probe arrangement is implemented at least by a capacitor divider network to facilitate acquisition of said RF voltage signal from said RF rod while reducing perturbation of RF power driving the plasma in said plasma processing system;
a signal processing arrangement configured to receive said RF voltage signal, the signal processing arrangement for generating a plurality of signals from said RF voltage signal, one of the signals in the plurality of signals having the first frequency and another one of the signals in the plurality of signals having the second frequency, the signal processing arrangement for applying one of a digital and analog version of the signal having the first frequency and the other signal having the second frequency to a transfer function to obtain a wafer bias; and
an ESC power supply subsystem configured to receive said wafer bias as a feedback signal to control said plasma processing system during processing of said at least one wafer.

14. The plasma processing system of claim 13, wherein said RF voltage signal is processed by said signal processing arrangement into the plurality of signals that includes at least a signal corresponding to an unfiltered broadband version of said RF voltage signal.

15. The plasma processing system of claim 14, wherein said signal processing arrangement is configured to calibrate said plurality of signals wherein said calibrating is responsive to said capacitor divider network.

16. The plasma processing system of claim 13, wherein said transfer function represents a linear transfer function.

17. The plasma processing system of claim 13, wherein said transfer function represents a non-linear transfer function.

18. The plasma processing system of claim 13, wherein the signal processing arrangement is configured to filter the signals in said plurality of signals to split the signals into the signal having the first frequency and the other signal having the second frequency.

19. The plasma processing system of claim 13, wherein the signal processing arrangement is configured to generate a peak magnitude of the signal having the first frequency and a peak magnitude of the other signal having the second frequency.

\* \* \* \* \*